(12) United States Patent
Dozen et al.

(10) Patent No.: US 9,716,208 B2
(45) Date of Patent: Jul. 25, 2017

(54) LIGHT-EMITTING DEVICE AND MANUFACTURING METHOD THEREOF

(71) Applicants: Semiconductor Energy Laboratory Co., Ltd., Kanagawa-ken (JP); Sharp Kabushiki Kaisha, Osaka (JP)

(72) Inventors: Yoshitaka Dozen, Kanagawa (JP); Hisao Ikeda, Kanagawa (JP); Yoshiharu Hirakata, Kanagawa (JP); Manabu Niboshi, Osaka (JP); Katsuhiro Kikuchi, Osaka (JP); Shinichi Kawato, Osaka (JP); Takashi Ochi, Osaka (JP); Yuto Tsukamoto, Osaka (JP); Tomohiro Kosaka, Osaka (JP); Tomofumi Osaki, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 0 days.

(21) Appl. No.: 14/109,043

(22) Filed: Dec. 17, 2013

(65) Prior Publication Data

US 2014/0175469 A1 Jun. 26, 2014

(30) Foreign Application Priority Data

Dec. 21, 2012 (JP) .................................. 2012-280103

(51) Int. Cl.
  *H01L 27/15* (2006.01)
  *H01L 33/00* (2010.01)
  *H01L 27/32* (2006.01)

(52) U.S. Cl.
  CPC ........ *H01L 33/005* (2013.01); *H01L 27/3246* (2013.01); *H01L 27/3211* (2013.01)

(58) Field of Classification Search
  CPC . H01L 33/005; H01L 27/3246; H01L 27/3211
  See application file for complete search history.

(56) References Cited

U.S. PATENT DOCUMENTS

| 6,107,734 | A  | 8/2000 | Tanaka et al. |
| 7,420,203 | B2 | 9/2008 | Tsutsui et al. |
| 7,473,923 | B2 | 1/2009 | Tsutsui et al. |
| 7,710,029 | B2 | 5/2010 | Yoshida et al. |

(Continued)

FOREIGN PATENT DOCUMENTS

| CN | 101543135 A | 9/2009 |
| CN | 102738406 A | 10/2012 |

(Continued)

*Primary Examiner* — Latanya N Crawford
(74) *Attorney, Agent, or Firm* — Husch Blackwell LLP

(57) ABSTRACT

Occurrence of a crosstalk phenomenon is prevented in a light-emitting device including a tandem element. The light-emitting device includes an insulating layer, a first lower electrode over the insulating layer, a second lower electrode over the insulating layer, a partition positioned over the insulating layer and between the first lower electrode and the second lower electrode, a first light-emitting unit over the first lower electrode, the partition, and the second lower electrode, intermediate layers over the first light-emitting unit, a second light-emitting unit over the intermediate layer, and an upper electrode over the second light-emitting unit. The partition has a first depression.

11 Claims, 7 Drawing Sheets

(56) References Cited

U.S. PATENT DOCUMENTS

| | | |
|---|---|---|
| 7,781,963 B2 | 8/2010 | Yoshida et al. |
| 7,956,349 B2 | 6/2011 | Tsutsui et al. |
| 7,956,353 B2 | 6/2011 | Tsutsui et al. |
| 8,008,860 B2 | 8/2011 | Yoshida et al. |
| 8,026,531 B2 | 9/2011 | Seo et al. |
| 8,217,573 B2 | 7/2012 | Yoshida et al. |
| 8,330,359 B2 | 12/2012 | Yoshida et al. |
| 8,816,339 B2 * | 8/2014 | Kawamura ......... H01L 27/3246 257/40 |
| 8,963,170 B2 | 2/2015 | Yokoyama et al. |
| 8,981,352 B2 | 3/2015 | Yamada et al. |
| 9,190,460 B2 | 11/2015 | Yokoyama et al. |
| 2003/0127967 A1 | 7/2003 | Tsutsui et al. |
| 2005/0156197 A1 | 7/2005 | Tsutsui et al. |
| 2005/0218409 A1 * | 10/2005 | Um et al. .................. 257/72 |
| 2006/0091797 A1 | 5/2006 | Tsutsui et al. |
| 2006/0214152 A1 | 9/2006 | Seo et al. |
| 2009/0045738 A1 | 2/2009 | Tsutsui et al. |
| 2009/0224664 A1 | 9/2009 | Yoshida et al. |
| 2011/0227119 A1 | 9/2011 | Tsutsui et al. |
| 2011/0227125 A1 | 9/2011 | Tsutsui et al. |
| 2012/0007110 A1 | 1/2012 | Seo et al. |
| 2012/0248467 A1 * | 10/2012 | Yokoyama et al. ............ 257/88 |
| 2013/0099210 A1 * | 4/2013 | Ikeda ................... H01L 51/5271 257/40 |
| 2013/0099221 A1 * | 4/2013 | Kawamura ......... H01L 27/3246 257/40 |
| 2013/0234126 A1 * | 9/2013 | Nakatani ............. H01L 27/3246 257/40 |

FOREIGN PATENT DOCUMENTS

| | | |
|---|---|---|
| EP | 2 077 698 A1 | 7/2009 |
| EP | 2 141 964 A1 | 1/2010 |
| JP | 11-329748 A | 11/1999 |
| JP | 2008-234885 | 10/2008 |
| JP | 2009-200061 A | 9/2009 |
| JP | 2012-216338 A | 11/2012 |
| JP | 2012-216495 A | 11/2012 |
| KR | 2009-0028513 A | 3/2009 |
| WO | WO 2008/149498 A1 | 12/2008 |
| WO | WO 2012/017498 A1 | 2/2012 |

* cited by examiner

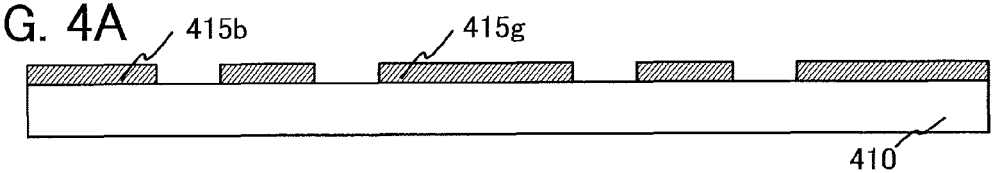
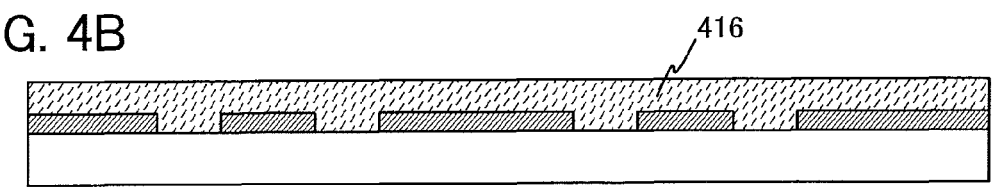
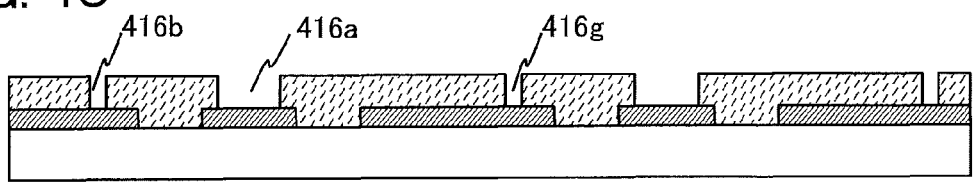
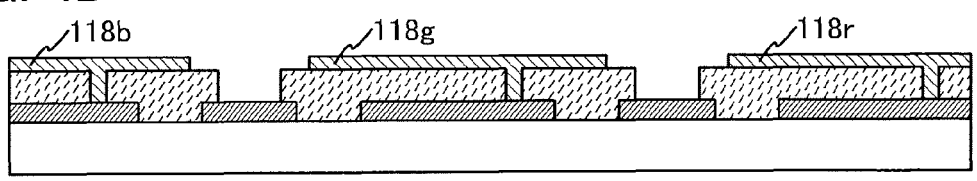
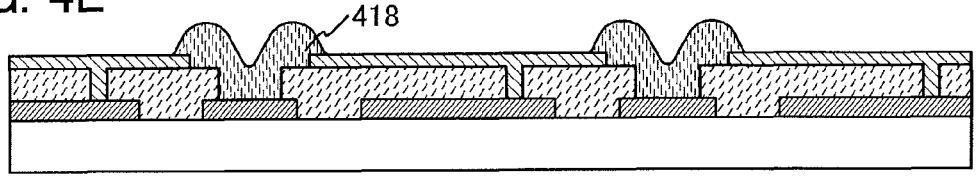
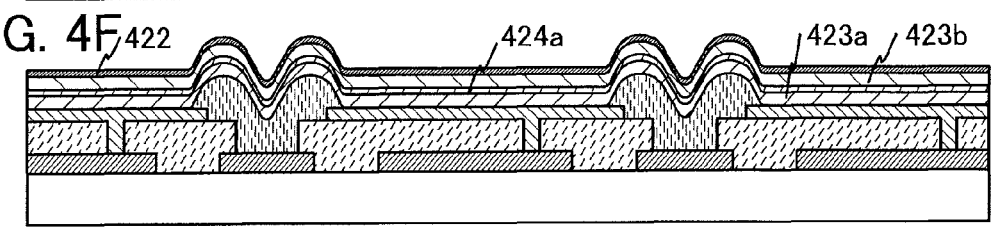
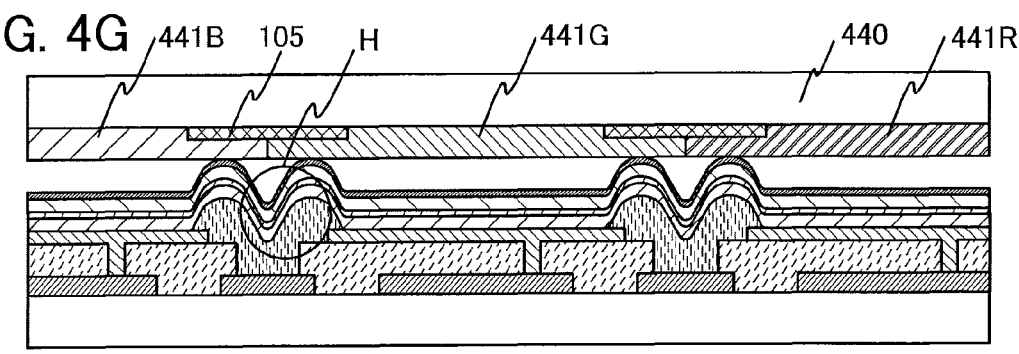

LIGHT-EMITTING DEVICE AND MANUFACTURING METHOD THEREOF

BACKGROUND OF THE INVENTION

1. Field of the Invention

The present invention relates to a light-emitting device including a light-emitting element and a method for manufacturing the light-emitting device, and particularly to a light-emitting device including a tandem element and a method for manufacturing the light-emitting device.

2. Description of the Related Art

Commercialization of organic EL displays is accelerating. The required luminance of displays is becoming higher year by year for outdoor use. It is known that the luminance of an organic EL element increases in proportion to electric current, and light emission at high luminance can be achieved.

However, a large current flow accelerates deterioration of organic EL elements. Thus, if high luminance can be achieved with a small amount of current, light-emitting elements can have longer lifetime. In this regard, a tandem element in which a plurality of light-emitting units is stacked has been proposed as a light-emitting element capable of providing high luminance with a small amount of current (see Patent Document 1, for example).

Note that in this specification, a light-emitting unit refers to a layer or a stacked body which includes one region where electrons and holes injected from both ends are recombined.

A tandem element can provide light emission comparable to that of one light-emitting element by making current with half the density of the light-emitting element flow through each light-emitting unit. For example, a structure in which n light-emitting units are stacked between electrodes can provide n times the luminance of one light-emitting unit without increasing current density.

One problem of a light-emitting panel in which tandem elements are provided adjacently is occurrence of a crosstalk phenomenon. The crosstalk phenomenon refers to a phenomenon in which, in the case where a highly conductive layer is provided in adjacent tandem elements, current leaks from one tandem element to another adjacent tandem element through the highly conductive layer.

A tandem element includes stacked layers with a highly conductive intermediate layer therebetween, and includes a layer with high conductivity and a layer with low conductivity in structure. In addition, in the tandem element, a mixed layer of an organic compound and a metal oxide or a highly conductive carrier-injection layer of a conductive high molecular compound is often used in order to decrease driving voltage. Furthermore, electrical resistance between an anode and a cathode in the tandem element is higher than in a single element; thus, current is easily transmitted to an adjacent pixel through the highly conductive layer.

FIG. 7A is a schematic view for describing the crosstalk phenomenon caused by a highly conductive intermediate layer 86. In the cross-sectional view of FIG. 7A, three stripes of tandem elements that emit white light are arranged in a light-emitting panel (white-light-emitting panel) and only a second tandem element is driven.

The light-emitting panel includes first to third tandem elements which are adjacent to one another. The first tandem element is provided between an upper electrode 81 and a first lower electrode 82. The second tandem element is provided between the upper electrode 81 and a second lower electrode 83. The third tandem element is provided between the upper electrode 81 and a third lower electrode 84.

In each of the first to third tandem elements, a first light-emitting unit 85, the intermediate layer 86, and a second light-emitting unit 87 are sequentially stacked. For example, when the first light-emitting unit 85 includes a light-emitting layer that emits blue light and the second light-emitting unit 87 includes a light-emitting layer that emits green light and a light-emitting layer that emits red light, each tandem element can provide white light emission.

In the case of using a light-transmitting upper electrode, a counter glass substrate 88 can be arranged over the upper electrode and reflective electrodes can be used as the lower electrodes. The counter glass substrate 88 is provided with a blue color filter, a red color filter, and a green color filter (not illustrated). The red color filter, the blue color filter, and the green color filter overlap with the first lower electrode 82, the second lower electrode 83, and the third lower electrode 84, respectively.

When only the blue line (the second tandem element) is driven in the above-described light-emitting panel by application of a voltage between the second lower electrode 83 and the upper electrode 81, current might leak to the adjacent first or third tandem element through the highly conductive intermediate layer 86, causing the red line (the first tandem element) or the green line (the third tandem element) to emit light and a crosstalk phenomenon to occur.

FIG. 7B is a schematic view for describing the crosstalk phenomenon caused by a highly conductive carrier-injection layer (hole-injection or electron-injection layer) 89. In FIG. 7B, only a blue line (a second tandem element) is driven in a light-emitting panel (white-light-emitting panel).

In each of first to third tandem elements, a first light-emitting unit 85 including the highly conductive carrier-injection layer 89, an intermediate layer 86, and a second light-emitting unit 87 are sequentially stacked. As an example of the carrier-injection layer 89, a highly conductive layer containing a mixed material of an organic compound and a metal oxide, a conductive high molecular compound, or the like can be given.

REFERENCE

Patent Document

[Patent Document 1] Japanese Published Patent Application No. 2008-234885

SUMMARY OF THE INVENTION

An object of one embodiment of the present invention is to prevent occurrence of a crosstalk phenomenon in a light-emitting device including a tandem element.

One embodiment of the present invention is a light-emitting device which includes an insulating layer; a first lower electrode over the insulating layer; a second lower electrode over the insulating layer; a partition over the insulating layer and between the first lower electrode and the second lower electrode; a first light-emitting unit over the first lower electrode, the partition, and the second lower electrode; an intermediate layer over the first light-emitting unit; a second light-emitting unit over the intermediate layer; and an upper electrode over the second light-emitting unit. In this light-emitting device, the partition has a first depression. In one embodiment of the present invention, a thickness of the intermediate layer over an inclined surface of the first depression in a direction perpendicular to the inclined surface may be smaller than a thickness of the intermediate layer over the first lower electrode in a direction perpendicular to the first lower electrode.

Further in one embodiment of the present invention, the insulating layer may have a second depression, the partition may be positioned in the second depression and over the insulating layer, and the first depression may be positioned over the second depression.

Further in one embodiment of the present invention, the first light-emitting unit may include a carrier-injection layer. In addition, a thickness of the carrier-injection layer over the inclined surface in the direction perpendicular to the inclined surface may be smaller than a thickness of the carrier-injection layer over the first lower electrode in the direction perpendicular to the first lower electrode. Further in one embodiment of the present invention, an EL layer may include the first light-emitting unit, the intermediate layer, and the second light-emitting unit. In addition, a thickness of the EL layer positioned over the inclined surface in the direction perpendicular to the inclined surface may be smaller than a thickness of the EL layer positioned over the first lower electrode in the direction perpendicular to the first lower electrode.

One embodiment of the present invention is a light-emitting device which includes an insulating layer; a first lower electrode over the insulating layer; a second lower electrode over the insulating layer; a partition positioned over the insulating layer and between the first lower electrode and the second lower electrode; a first light-emitting unit over the first lower electrode, the partition, and the second lower electrode; an intermediate layer over the first light-emitting unit; a second light-emitting unit over the intermediate layer; and an upper electrode over the second light-emitting unit. In this light-emitting device, the partition has a valley, a first mountain positioned on the first lower electrode side of the valley, and a second mountain positioned on the second lower electrode side of the valley. In addition, a thickness of the intermediate layer positioned over a first inclined surface between a top of the first mountain and the valley in a direction perpendicular to the first inclined surface and a thickness of the intermediate layer positioned over a second inclined surface between a top of the second mountain and the valley in a direction perpendicular to the second inclined surface are each smaller than a thickness of the intermediate layer positioned over the first lower electrode in a direction perpendicular to the first lower electrode.

Further in one embodiment of the present invention, the insulating layer may have a groove, the partition may be positioned in the groove and over the insulating layer, and the valley may be positioned over a bottom of the groove.

Further in one embodiment of the present invention, the first light-emitting unit may include a carrier-injection layer. In addition, a thickness of the carrier-injection layer positioned over the first inclined surface in the direction perpendicular to the first inclined surface and a thickness of the carrier-injection layer positioned over the second inclined surface in the direction perpendicular to the second inclined surface may each be smaller than a thickness of the carrier-injection layer positioned over the first lower electrode in the direction perpendicular to the first lower electrode. Further in one embodiment of the present invention, an EL layer may include the first light-emitting unit, the intermediate layer, and the second light-emitting unit. In addition, a thickness of the EL layer positioned over the first inclined surface in the direction perpendicular to the first inclined surface and a thickness of the EL layer positioned over the second inclined surface in the direction perpendicular to the second inclined surface may each be smaller than a thickness of the EL layer positioned over the first lower electrode in the direction perpendicular to the first lower electrode.

Further in one embodiment of the present invention, a color filter may be included near or in contact with the upper electrode positioned over the partition, and colors of the color filter may be a first color in a region overlapping with the first lower electrode and a second color in a region overlapping with the second lower electrode.

Further in one embodiment of the present invention, the partition may be colored.

One embodiment of the present invention is a method for manufacturing a light-emitting device, which includes the steps of forming a first lower electrode and a second lower electrode over an insulating layer; forming a partition over the insulating layer and between the first lower electrode and the second lower electrode; forming a first light-emitting unit over the first lower electrode, the partition, and the second lower electrode; forming an intermediate layer over the first light-emitting unit; forming a second light-emitting unit over the intermediate layer; and forming an upper electrode over the second light-emitting unit. In this light-emitting device, the partition has a first depression. One embodiment of the present invention is a method for manufacturing a light-emitting device, which includes the steps of: forming an insulating layer over a first wiring and a second wiring; forming a first contact hole over the first wiring, a second contact hole over the second wiring, and a second depression, in the insulating layer by processing the insulating layer; forming a first lower electrode on one side of the second depression, in the first contact hole and over the insulating layer, and forming a second lower electrode on the other side of the second depression, in the second contact hole and over the insulating layer; forming a partition in the second depression and over the insulating layer; forming a first light-emitting unit over the first lower electrode, the partition, and the second lower electrode; forming an intermediate layer over the first light-emitting unit; forming a second light-emitting unit over the intermediate layer; and forming an upper electrode over the second light-emitting unit. In this light-emitting device, the partition has a first depression positioned over the second depression. Further in one embodiment of the present invention, a thickness of the intermediate layer positioned over an inclined surface of the first depression in the direction perpendicular to the inclined surface may be smaller than a thickness of the intermediate layer positioned over the first lower electrode in the direction perpendicular to the first lower electrode.

Further in one embodiment of the present invention, the first light-emitting unit may include a carrier-injection layer. In addition, a thickness of the carrier-injection layer positioned over the inclined surface in the direction perpendicular to the inclined surface may be smaller than a thickness of the carrier-injection layer positioned over the first lower electrode in the direction perpendicular to the first lower electrode. Further in one embodiment of the present invention, an EL layer may include the first light-emitting unit, the intermediate layer, and the second light-emitting unit. In addition, a thickness of the EL layer positioned over the inclined surface in the direction perpendicular to the inclined surface may be smaller than a thickness of the EL layer positioned over the first lower electrode in the direction perpendicular to the first lower electrode.

One embodiment of the present invention is a method for manufacturing a light-emitting device, which includes the steps of: forming an insulating layer over a first wiring and a second wiring; forming a first contact hole over the first wiring, a second contact hole over the second wiring, and a groove, in the insulating layer by processing the insulating layer; forming a first lower electrode on one side of the groove, in the first contact hole and over the insulating layer, and forming a second lower electrode on the other side of the groove, in the second contact hole and over the insulating layer; forming a partition in the groove and over the insulating layer; forming a first light-emitting unit over the first lower electrode, the partition, and the second lower electrode; forming an intermediate layer over the first light-emitting unit; forming a second light-emitting unit over the intermediate layer; and forming an upper electrode over the second light-emitting unit. In this light-emitting device, the partition has a valley positioned over a bottom of the groove, a first mountain positioned on the first lower electrode side of the valley, and a second mountain positioned on the second lower electrode side of the valley. In addition, a thickness of the intermediate layer positioned over a first inclined surface between a top of the first mountain and the valley in a direction perpendicular to the first inclined surface and a thickness of the intermediate layer positioned over a second inclined surface between a top of the second mountain and the valley in a direction perpendicular to the second inclined surface are each smaller than a thickness of the intermediate layer positioned over the first lower electrode in a direction perpendicular to the first lower electrode.

Further in one embodiment of the present invention, the first light-emitting unit may include a carrier-injection layer. In addition, a thickness of the carrier-injection layer positioned over the first inclined surface in the direction perpendicular to the first inclined surface and a thickness of the carrier-injection layer positioned over the second inclined surface in the direction perpendicular to the second inclined surface may each be smaller than a thickness of the carrier-injection layer positioned over the first lower electrode in the direction perpendicular to the first lower electrode. Further in one embodiment of the present invention, an EL layer may include the first light-emitting unit, the intermediate layer, and the second light-emitting unit. In addition, a thickness of the EL layer positioned over the first inclined surface in the direction perpendicular to the first inclined surface and a thickness of the EL layer positioned over the second inclined surface in the direction perpendicular to the second inclined surface may each be smaller than a thickness of the EL layer positioned over the first lower electrode in the direction perpendicular to the first lower electrode.

Further in one embodiment of the present invention, the step of forming a color filter near or in contact with the upper electrode positioned over the partition is included after the step of forming the upper electrode. In addition, colors of the color filter may be a first color in a region overlapping with the first lower electrode and a second color in a region overlapping with the second lower electrode.

Further in one embodiment of the present invention, the partition may be colored.

Note that a light-emitting device in this specification includes a display device having a light-emitting element in a pixel (or a sub-pixel). A light-emitting panel includes a display panel where pixels each having a light-emitting element are provided adjacently. Note that a light-emitting module includes a light-emitting element, and the light-emitting element has a light-emitting unit including a light-emitting layer.

With one embodiment of the present invention, occurrence of a crosstalk phenomenon can be prevented.

BRIEF DESCRIPTION OF THE DRAWINGS

In the accompanying drawings:

FIGS. 4A to 4G are cross-sectional views illustrating a method for forming partitions in one embodiment of the present invention;

DETAILED DESCRIPTION OF THE INVENTION

Embodiments of the present invention will be described in detail below with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiments.

Embodiment 1

Display Panel Structure

Figure 1A:
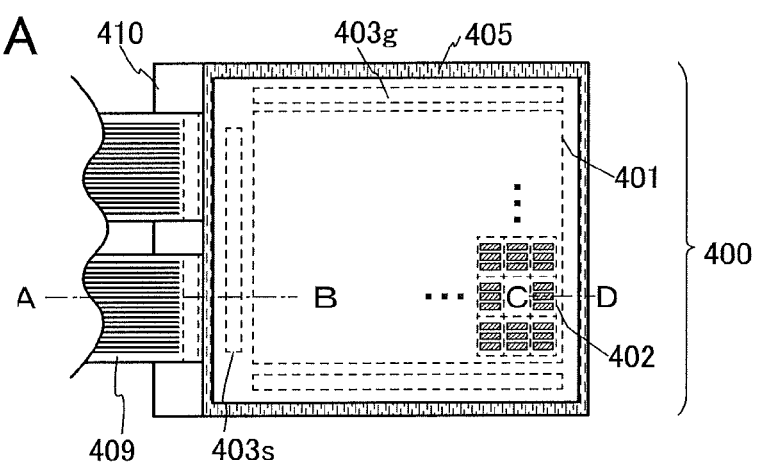
FIG. 1A is a top view illustrating a structure of a display panel that can be used for a display device of one embodiment of the present invention.
Figure 1B:
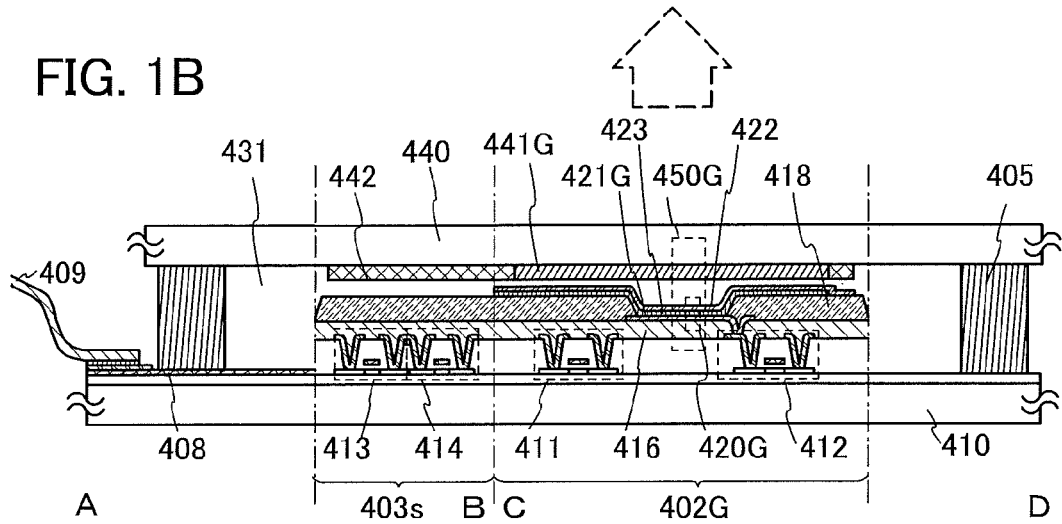
FIG. 1B is a side view illustrating the cross section of the structure along section lines A-B and C-D in FIG. 1A.

FIGS. 1A and 1B illustrate a structure of a display panel that can be used for a display device of one embodiment of the present invention. FIG. 1A is a top view of the structure of the display panel which can be used for a display device of one embodiment of the present invention, and FIG. 1B is a side view illustrating the cross section of the structure along section lines A-B and C-D in FIG. 1A.

A display panel 400 shown as an example in this embodiment includes a display portion 401 over a first substrate 410. The display portion 401 includes a plurality of pixels 402. The pixel 402 includes a plurality of sub-pixels (e.g., three sub-pixels) (see FIG. 1A). Over the first substrate 410, in addition to the display portion 401, a source side driver circuit portion 403s and a gate side driver circuit portion 403g which drive the display portion 401 are provided. Note that the driver circuit portions can be provided not over the first substrate 410 but externally.

The display panel 400 includes an external input terminal and receives a video signal, a clock signal, a start signal, a reset signal, and the like from an FPC (flexible printed circuit) 409.

A sealant 405 bonds the first substrate 410 and a second substrate 440. The display portion 401 is provided in a space 431 formed between the substrates (see FIG. 1B).

The structure of the cross sections of the display panel 400 is described with reference to FIG. 1B. The display panel 400 includes the source side driver circuit portion 403s, a sub-pixel 402G included in the pixel 402, and a lead wiring 408. Note that the display portion 401 of the display panel 400 shown as an example in this embodiment emits light in the direction denoted by the arrow in the drawing, thereby displaying images.

The source side driver circuit portion 403s includes a CMOS circuit which is a combination of an n-channel transistor 413 and a p-channel transistor 414. Note that the driver circuit is not limited to this structure and may be various circuits, such as a CMOS circuit, a PMOS circuit, or an NMOS circuit.

The lead wiring 408 transmits a signal input from an external input terminal to the source side driver circuit portion 403s and the gate side driver circuit portion 403g.

The sub-pixel 402G includes a switching transistor 411, a current control transistor 412, and a light-emitting module 450G. Note that an insulating layer 416 and a partition 418 are formed over the transistor 411 and the like. The light-emitting module 450G includes a reflective film, a semi-transmissive/semi-reflective film, a light-emitting element 420G between the reflective film and the semi-transmissive/semi-reflective film, and a color filter 441G provided on the semi-transmissive/semi-reflective film side through which light emitted from the light-emitting element 420G is extracted. In the light-emitting module 450G shown as an example in this embodiment, a second lower electrode 421G and an upper electrode 422 of the light-emitting element 420G also serve as the reflective film and the semi-transmissive/semi-reflective film, respectively. Note that the image displaying direction of the display portion 401 is determined in accordance with the direction in which light emitted from the light-emitting element 420G is extracted.

In addition, a light-blocking film 442 is formed so as to surround the color filter 441G. The light-blocking film 442 prevents a phenomenon in which the display panel 400 reflects outside light and has an effect of increasing the contrast of images displayed on the display portion 401. Note that the color filter 441G and the light-blocking film 442 are formed on the second substrate 440.

The insulating layer 416 is an insulating layer for planarizing a step due to the structure of the transistor 411 and the like or for preventing impurity diffusion to the transistor 411 and the like. The insulating layer 416 can be a single layer or a plurality of stacked layers. The partition 418 is an insulating layer having an opening; the light-emitting element 420G is formed in the opening of the partition 418.

The light-emitting element 420G includes the second lower electrode 421G the upper electrode 422, and a layer containing a light-emitting organic compound (hereinafter also referred to as an EL layer) 423.

<Transistor Structure>

Top-gate transistors are used in the display panel 400 illustrated as an example in FIGS. 1A and 1B. However, the present invention is not limited to this example, and bottom-gate transistors may be used as well. Various types of transistors can be used for the source side driver circuit portion 403s, the gate side driver circuit portion 403g, and the sup-pixels. Note that various semiconductors can be used for a region where channels of these transistors are formed. Specifically, as well as amorphous silicon, polysilicon, or single crystal silicon, an oxide semiconductor or the like can be used. As an example of an oxide semiconductor, an oxide semiconductor containing at least indium (In) or zinc (Zn) can be given, and an oxide semiconductor containing. In and Zn is preferable. Further, these oxide semiconductors containing gallium (Ga) or tin (Sn) or both of them are particularly preferable.

In the case of using a single crystal semiconductor for a region where a channel of a transistor is formed, the size of the transistor can be reduced, which results in higher resolution pixels in a display portion.

As a single crystal semiconductor used for forming a semiconductor layer, a semiconductor substrate, such as a single crystal silicon substrate, or a silicon on insulator (SOI) substrate in which a single crystal semiconductor layer is provided on an insulating surface can be used.

<Pixel Configuration>

Figure 2A:
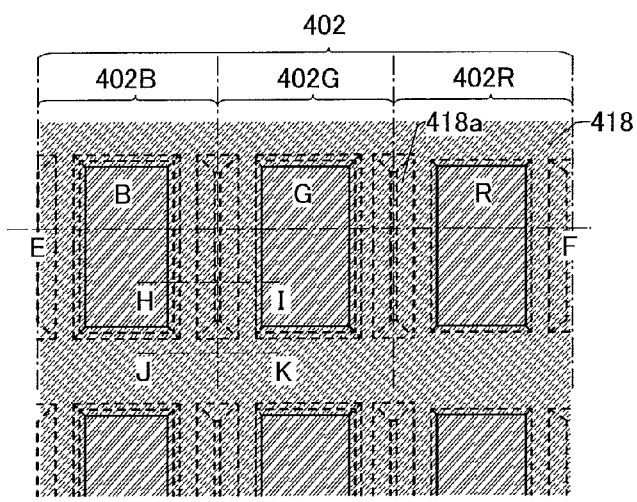
FIG. 2A is a top view of a structure of a pixel.
Figure 2B:
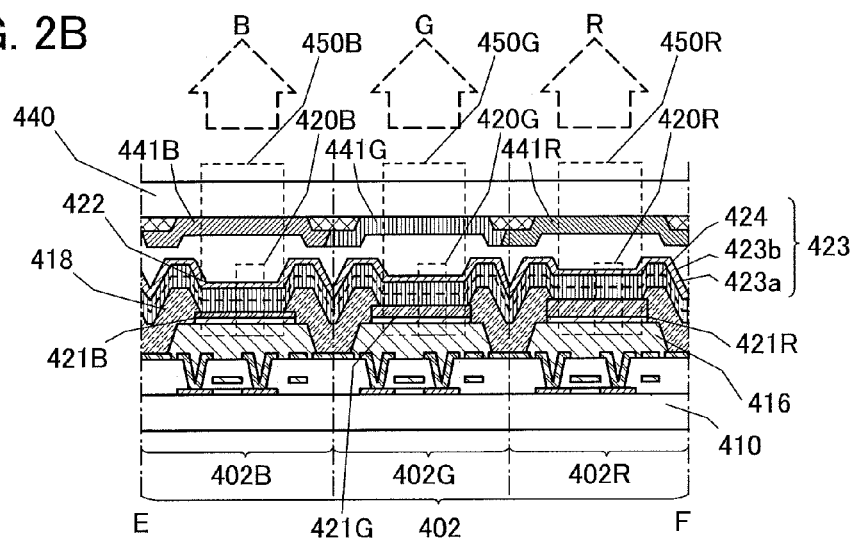
FIG. 2B is a side view illustrating the cross section of the structure along section line E-F in FIG. 2A.
Figure 2C:
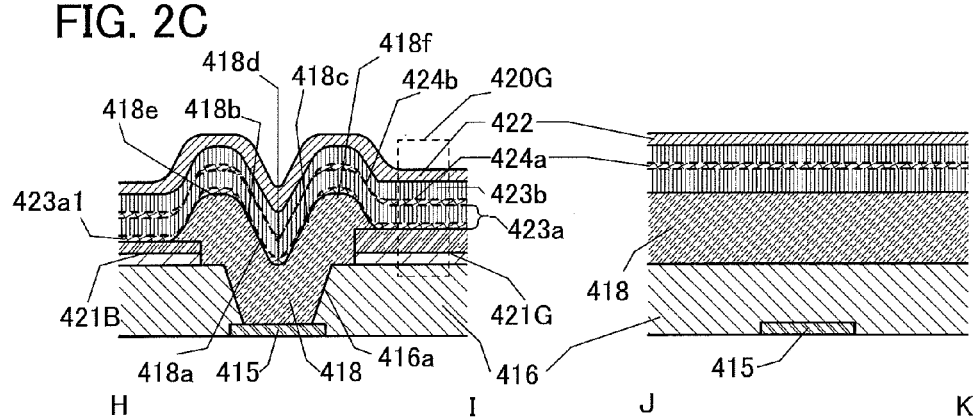
FIG. 2C is a side view illustrating cross sections of the structure of the pixel along section lines H-I and J-K in FIG. 2A.

The structure of the pixel 402 included in the display portion 401 is described with reference to FIG. 2B. FIG. 2A is a top view of a structure of the pixel 402, FIG. 2B is a side view illustrating the cross section of the structure along section line E-F in FIG. 2A, and FIG. 2C is a side view illustrating cross sections of the structure of the pixel along section lines H-I and J-K in FIG. 2A.

The pixel 402 described as an example in this embodiment includes the sub-pixel 402G. The sub-pixel 402G includes the second lower electrode 421G also serving as a reflective film, the upper electrode 422 also serving as a semi-transmissive/semi-reflective film, the EL layer 423 including a light-emitting unit 423a, a light-emitting unit 423b, and an intermediate layer 424 between the light-emitting unit 423a and the light-emitting unit 423b. The conductivity of the intermediate layer 424 is higher than that of the light-emitting unit 423a. The sub-pixel 402G further includes the color filter 441G that overlaps with the light-emitting element 420G and is provided on the upper electrode 422 side (see FIG. 2B).

The pixel 402 includes a sub-pixel 402B that emits blue light B, the sub-pixel 402G that emits green light and a sub-pixel 402R that emits red light R. Each sub-pixel includes a driver transistor and a light-emitting module 450B, 450G or 450R. Each light-emitting module includes a reflective film, a semi-transmissive/semi-reflective film, and a light-emitting element 420B, 420Q or 420R between the reflective film and the semi-transmissive/semi-reflective film.

The structure of the light-emitting module includes the light-emitting element 420G which includes the EL layer 423 including the light-emitting unit 423a, the light-emitting unit 423b, and the intermediate layer 424 between the second lower electrode 421G also serving as a reflective film and the upper electrode 422 also serving as a semi-transmissive/semi-reflective film.

With the structure where the reflective film and the semi-transmissive/semi-reflective film overlap to form a microresonator and the light-emitting element 420G is provided therebetween, light with a specific wavelength can be efficiently extracted through the semi-transmissive/semi-reflective film. The light extraction efficiency can be increased by adjusting the optical path length of the microresonator so as to increase the intensity of the extracted light. The wavelength of the extracted light depends on the distance between the reflective film and the semi-transmissive/semi-reflective film, and the distance can be adjusted by providing an optical adjustment layer between the reflective film and the semi-transmissive/semi-reflective film.

A conductive film having light-transmitting properties to visible light or a layer containing a light-emitting organic compound can be employed for a material that can be used for the optical adjustment layer. For example, the thickness of a charge-generation region may be adjusted so that the charge-generation region also serves as the optical adjustment layer. Alternatively, the thickness of a region containing a substance having a high hole-transport property and a substance exhibiting an acceptor property with respect to the substance having a high hole-transport property may be adjusted so that the layer of the mixed substances also serves as the optical adjustment layer. This structure is preferably used because an increase in driving voltage can be prevented even when the optical adjustment layer is thick.

Note that the structural example of the light-emitting element will be described in detail in Embodiment 2.

The light-emitting modules 450B, 450G, and 450R shown as an example in this embodiment each has a structure in which the upper electrode 422 of the light-emitting element in the light-emitting module also serves as a semi-transmissive/semi-reflective film. Specifically, the upper electrode 422 shared by the light-emitting elements 420B, 420G and 420R also serves as a semi-transmissive/semi-reflective film of the light-emitting modules 450B, 450G, and 450R.

In addition, the lower electrode of the light-emitting element is provided in an electrically independent manner in each of the light-emitting module, and the lower electrode also serves as a reflective film of the light-emitting module. Specifically, a first lower electrode 421B provided in the light-emitting element 420B also serves as a reflective film of the light-emitting module 450B, a second lower electrode 421G provided in the light-emitting element 420G also serves as a reflective film of the light-emitting module 450G and a third lower electrode 421R provided in the light-emitting element 420R also serves as a reflective film of the light-emitting module 450R.

The first to third lower electrodes 421B, 421G, and 421R also serving as reflective films of the light-emitting modules 450B, 450G, and 450R each have an optical adjustment layer over the reflective film. The optical adjustment layer is preferably formed of a conductive film having light-transmitting properties with respect to visible light, and the reflective film is preferably formed of a conductive metal film having high reflectivity with respect to visible light.

The thickness of the optical adjustment layer is adjusted in accordance with the wavelength of light extracted from the light-emitting module. Specific description is given below.

For example, the light-emitting module 450B includes a color filter 441B which transmits blue light, the first lower electrode 421B also serving as a reflective film, and the upper electrode 422 also serving as a semi-transmissive/semi-reflective film; the optical path length between the first lower electrode 421B and the upper electrode 422 is adjusted so as to increase the intensity of light having a wavelength greater than or equal to 400 nm and less than 500 nm.

Further, the light-emitting module 450G includes the color filter 441G which transmits green light, the second lower electrode 421G also serving as a reflective film, and the upper electrode 422 also serving as a semi-transmissive/semi-reflective film; the optical path length between the reflective film and the semi-transmissive/semi-reflective film is adjusted so as to increase the intensity of light having a wavelength greater than or equal to 500 nm and less than 600 nm.

Further, the light-emitting module 450R includes a color filter 441R which transmits red light, the third lower electrode 421R also serving as a reflective film, and the upper electrode 422 also serving as a semi-transmissive/semi-reflective film; the optical path length between the reflective film and the semi-transmissive/semi-reflective film is adjusted so as to increase the intensity of light having a wavelength greater than or equal to 600 nm and less than 800 nm.

In such a light-emitting module, light emitted from the light-emitting element interferes between the reflective film and the semi-transmissive/semi-reflective film, the intensity of light having a specific wavelength among light having a wavelength of greater than or equal to 400 nm and less than 800 nm is increased, and the color filter absorbs unnecessary light.

Note that the light-emitting module 450B, the light-emitting module 450G, and the light-emitting module 450R each include the EL layer 423 including the light-emitting unit 423a, the light-emitting unit 423b, and the intermediate layer 424. In addition, one of a pair of electrodes in each of the light-emitting elements 420B, 420G, and 420R (the first lower electrode 421B, the second lower electrode 421G, the third lower electrode 421R, and the upper electrode 422) also serves as a reflective film, and the other also serves as a semi-transmissive/semi-reflective film.

In the light-emitting modules with such a structure, light-emitting units can be formed in the same process.

<Partition Structure>

The drawing on the left in FIG. 2C is a side view illustrating the cross section of the structure along section line H-I in FIG. 2A. The drawing on the right in FIG. 2C is a side view illustrating the cross section of the structure along section line J-K in FIG. 2A.

As illustrated in FIG. 2A, the partition 418 is formed so as to surround the pixel 402 and the sub-pixels 402B, 402G; and 402R (see FIG. 2A). The partition 418 covers edge portions of the first lower electrode 421B, the second lower electrode 421G, and the third lower electrode 421R (see FIG. 2B). As a material of the partition 418, a negative or positive photosensitive resin can be used.

Figure 3A:
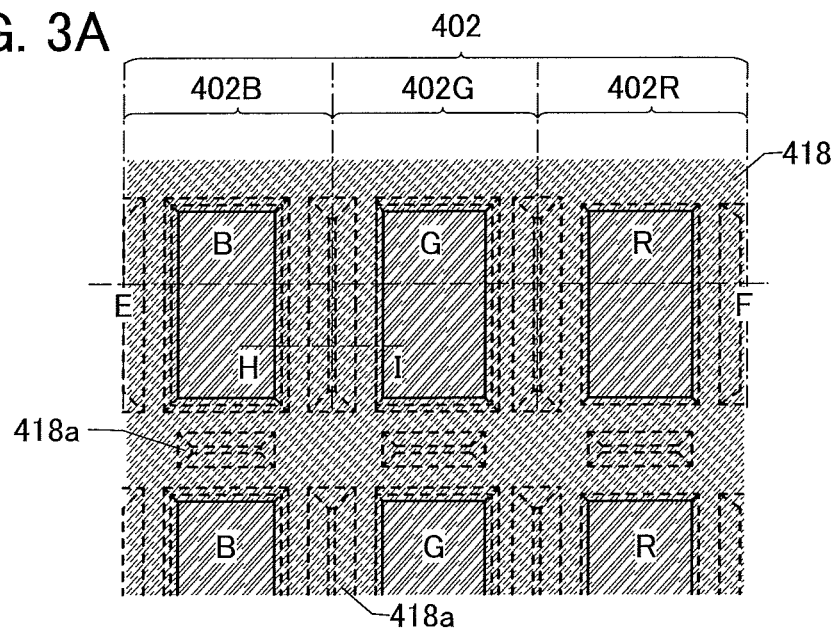
FIG. 3A is a top view illustrating a pixel in a display device of one embodiment of the present invention.

Further, the partition 418 has a first depression 418a and a first inclined surface 418b and a second inclined surface 418c which are formed by the first depression 418a. The first depression 418a preferably has a curved surface with curvature. The first depression 418a of the partition 418 in a light-emitting panel illustrated in FIG. 2A is provided between adjacent two of the sub-pixels 402B, 402G and 402R, which emit lights of different colors from one another. The first depression 418a is not provided between sub-pixels that emit lights of the same color. However, the arrangement of the first depression 418a of the partition 418 is not limited to that illustrated in FIG. 2A. The first depression 418a of the partition 418 may be provided between sub-pixels that emit lights of the same color as well as between adjacent two of the sub-pixels 402B, 402G, and 402R that emit lights of different colors, like a light-emitting panel illustrated in FIG. 3A. In other words, the first depression 418a of the partition 418 may be provided between adjacent two of all the sub-pixels.

More specifically, the partition 418 includes a valley 418d, a first mountain 418e positioned on the first lower electrode 421B side of the valley 418d, and a second mountain 418f positioned on the second lower electrode 421G side of the valley 418d (see FIG. 2C).

As an example of the method for forming the first depression 418a of the partition 418, there is a method in which a groove 416a serving as a second depression is formed in a layer serving as a base of the partition 418, for example, in the insulating layer 416 and the partition 418 is formed so as to overlap with the groove 416a (see FIG. 2C). The groove 416a of the insulating layer 416 can be formed in the same step as the step of forming an opening (not illustrated) through which the second lower electrode 421G is connected to the transistor, in which case the process can be simplified. A wiring 415 may be provided below the insulating layer 416 and used as an etching stopper in etching of the insulating layer 416, in order to form the groove 416a.

Alternatively, the partition 418 may have more than one first depression 418a. That is, the partition 418 may have more than one valley and more than two mountains. As an example of the formation method in this case, there is a method in which more than one groove 416a serving as a second depression is provided in the insulating layer 416 and the partitions 418 are formed so as to overlap with the grooves 416a.

A specific method for forming the first depression of the partition 418 is described below.

The thickness of the EL layer 423 in a direction perpendicular to the first inclined surface (the inclined surface of the groove 416a serving as the second depression) 418b of the partition 418 and the thickness of the EL layer 423 in a direction perpendicular to the second inclined surface (the inclined surface of the groove 416a serving as the second depression) 418c of the partition 418 are smaller than that in a direction perpendicular to the second lower electrode 421E. Similarly, the thickness of a highly conductive layer (e.g., a carrier-injection layer 423a1) included in the EL layer 423 in the direction perpendicular to the first inclined surface 418b of the partition 418 and the thickness of the highly conductive layer in the direction perpendicular to the second inclined surface 418c of the partition 418 are smaller than that in a direction perpendicular to the second lower electrode 421G (FIG. 2C). This increases the electrical resistance of the highly conductive layer and weakens the conductivity thereof in parts overlapping with the inclined surfaces of the partition 418. Consequently, current flow in the intermediate layer is prevented, and the crosstalk phenomenon between adjacent pixels or sub-pixels emitting lights of different colors can be prevented.

Further, the thickness of an intermediate layer 424b in the direction perpendicular to the first inclined surface 418b of the partition 418 and the thickness of the intermediate layer 424b in the direction perpendicular to the second inclined surface 418c are smaller than the thickness of an intermediate layer 424a in the direction perpendicular to the second lower electrode 421G. This increases the electrical resistance of the intermediate layer 424b and weakens the conductivity thereof in parts overlapping with the inclined surfaces of the partition 418. Consequently, current flow in the intermediate layer is prevented, and the crosstalk phenomenon between adjacent pixels or sub-pixels emitting lights of different colors can be prevented.

Furthermore, although the EL layer 423 including the intermediate layer 424b and the upper electrode 422 may be disconnected at regions overlapping with the first and second inclined surfaces 418b and 418c of the partition 418, it is preferable that the upper electrode 422 is not disconnected. In the case where the upper electrode 422 is not disconnected, the potential of the upper electrode 422 is equal between adjacent pixels, and the upper electrode 422 has an equal potential in terms of a plane, or preferably the entire upper electrode 422 has an equal potential. Thus, an effect of preventing voltage drop or the like can be obtained.

The provision of the first depression 418a in the partition 418 elongates the path of current from one sub-pixel to the adjacent sub-pixel. That is, the length of the intermediate layer 424b over the first depression 418a is larger than that of the intermediate layer 424b over a partition without the first depression. Accordingly, the electrical resistance of the intermediate layer 424b over the first depression 418a can be increased. Consequently, current flow in the intermediate layer is prevented, and the crosstalk phenomenon between pixels or sub-pixels can be prevented. In other words, electrical crosstalk can be prevented by elongating the path of current in the intermediate layer 424b, without increasing the height of the partition.

Further, the color filter 441G may be provided near or in contact with the upper electrode 422 positioned over the partition 418, so that the color filter 441G can be provided near the light-emitting element 420G. In this case, optical crosstalk that is observed from an oblique direction to the sub-pixel (also referred to as light leakage) can be prevented.

Specifically, if the distance between the color filter 441G and the light-emitting element 420G is long, light enters color filters 441B and 441R that are adjacent to the light-emitting element 420G in a light emission state, whereby color purity is lowered. In the case of forming two or more mountains 418e and 418f with a large degree of taper in the partition 418, the height of the partition 418 can be set smaller, as compared with the case of forming a partition with one mountain without valleys. Accordingly, when the color filter 441G that is near or in contact with the upper electrode 422 positioned over the smaller height partition 418 is provided so as to overlap with the light-emitting element 420E the distance between the color filter 441G and the light-emitting element 420G can be smaller than that in the case of the partition with one mountain without valleys, whereby color purity of the panel can be improved.

Further, the valley 418d formed between the two mountains 418e and 418f hinders waveguide light from traveling in a straight line, so that it is difficult that light from one pixel passes through the partition 418 and reaches the adjacent pixel. As a result, optical crosstalk can be prevented.

Moreover, when the first depression 418a is provided in the partition 418 and the partition 418 is formed of a material that absorbs visible light and is colored, the partition can absorb waveguide light from the light-emitting element. Thus, an effect of preventing light leakage from a light-emitting element to the adjacent light-emitting element can be provided.

Further, a structure of displaying images on the first substrate 410 side may be employed by providing a semi-transmissive/semi-reflective film on the first substrate 410 side as a lower electrode including the first lower electrode and the second lower electrode and extracting light emitted from the light-emitting module, on the first substrate 410 side.

<Sealing Structure>

The display panel 400 illustrated as an example in this embodiment has a structure in which the light-emitting element is sealed in the space 431 enclosed by the first substrate 410, the second substrate 440, and the sealant 405 (see FIGS. 1A and 1B).

The space 431 can be filled with an inert gas (e.g., nitrogen or argon) or resin. An absorbent for impurities (typically, water and/or oxygen) such as a dry agent may be provided in the space 431.

The sealant 405 and the second substrate 440 are desirably formed using a material which does not transmit impurities in the air (typically, water and/or oxygen) as much as possible. An epoxy-based resin, glass frit, or the like can be used as the sealant 405.

Examples of the second substrate 440 include a glass substrate; a quartz substrate; a plastic substrate formed of polyvinyl fluoride (PVF), polyester, an acrylic resin, or the like; a substrate of fiberglass-reinforced plastics (FRP); and the like.

<Partition Forming Method>

FIGS. 4A to 4G are cross-sectional views illustrating a method for forming a partition according to one embodiment of the present invention. First, a first wiring 415b and a second wiring 415g are formed over the first substrate 410 (see FIG. 4A).

Then, the photosensitive insulating layer 416 serving as a planarization film is formed over the first wiring 415b, the second wiring 415g, and the first substrate (see FIG. 4B).

Next, the photosensitive insulating layer 416 is exposed to light and developed, so that a first contact hole 416b and a second contact hole 416g, which are positioned over the first wiring 415b and the second wiring 415g respectively, and the groove 416a serving as the second depression are formed in the insulating layer 416 (see FIG. 4C). In this manner, the first contact hole 416b, the second contact hole 416g, and the groove 416a, which is a countermeasure for crosstalk, can be formed in the same step. Note that in the case of using the nonphotosensitive insulating layer 416, the first contact hole 416b, the second contact hole 416g, and the groove 416a serving as the second depression are formed by an etching method. At this time, by arranging the first wiring 415b, the second wiring 415g, and a wiring between the first wiring 415b and the second wiring 415g under the first contact hole 416b, the second contact hole 416g, and the groove 416a respectively, the first wiring 415b, the second wiring 415g, and the wiring between the first wiring 415b and the second wiring 415g function as etching stoppers.

Note that the first contact hole 416b and the second contact hole 416g need to reach the first wiring 415b and the second wiring 415g, and the groove 416a does not necessarily reach the wiring. To form the groove 416a that does not reach the wiring, light exposure is performed in two steps using a photomask for forming the first and second contact holes 416b and 416g and another photomask; alternatively, light exposure is performed using a half-tone mask.

Next, an electrode layer is formed over the first contact hole 416b, the second contact hole 416g, the groove 416a, and the insulating layer 416, a photoresist film (not illustrated) is formed over this electrode layer, and the photoresist film is exposed to light and developed, whereby a resist mask is found over the electrode layer. Then, the electrode layer is etched using this resist mask, whereby a lower electrode including a first lower electrode 118b, a second lower electrode 118g, and a third lower electrode 118r is formed (see FIG. 4D). Specifically, the first lower electrode 118b on one side of the groove 416a is formed in the first contact hole 416b and over the insulating layer 416, and the second lower electrode 118g on the other side of the groove 416a is formed in the second contact hole 416g and over the insulating layer 416. Note that the first lower electrode 118b and the second lower electrode 118g are not formed in the groove 416a.

Next, the partition 418 is formed in the groove 416a, over an edge portion of the first lower electrode 118b, and over an edge portion of the second lower electrode 118g (see FIG. 4E). This partition 418 has a first depression positioned over the groove 416a serving as the second depression and first and second inclined surfaces formed by the first depression. In other words, the partition 418 has a valley positioned over the bottom of the groove 416a, a first mountain positioned on the first lower electrode 118b side of this valley, and a second mountain positioned on the second lower electrode 118g side of the valley. The first inclined surface is formed between the top of the first mountain and the valley, and the second inclined surface is formed between the top of the second mountain and the valley.

Specifically, a photosensitive resin layer is formed over the insulating layer 416, in which the groove 416a serving as the second depression is provided, and the lower electrode including the first and second lower electrodes 118b and 118g. At this time, the photosensitive resin layer is affected by the groove 416a and thus the first depression is formed over the groove 416a. Then, the photosensitive resin layer is exposed to light and developed using a photomask, so that the partition 418 having the first depression over the groove 416a is formed. Note that the material of the layer formed along the shapes of the lower electrode including the first lower electrode 118b and the second lower electrode 118g and the groove 416a (a layer to be processed into the partition) may be a material other than a photosensitive material; in such a case, the partition may be formed by stacking a photoresist film over the layer and patterning the layer into an island shape by photolithography.

Figure 3B:
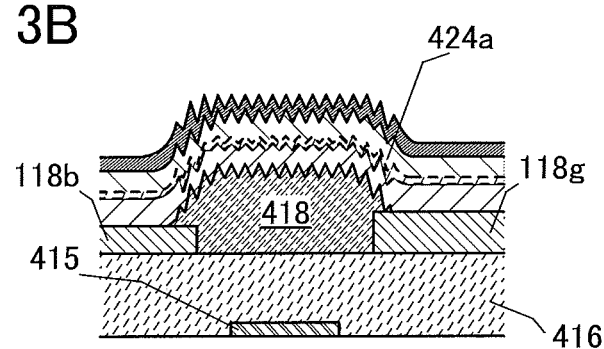
FIG. 3B is a side view illustrating a modification example of a method for providing a partition 418 with a first depression.

As a modification example of the method for providing the partition 418 with the first depression, there is a method in which the partition 418 is irradiated with plasma. Irradiation of the partition 418 with plasma can make a surface of the partition 418 rough and provide a plurality of depressions with small widths and small depths. Note that the structure with a plurality of depressions with small widths and small depths may be applied to not only the above-described partition 418 formed over the insulating layer 416 in which the groove is provided but also the partition 418 formed over the insulating layer in which the groove is not provided (see FIG. 3B).

As another modification example of the method for providing the partition 418 with the first depression, a method using a multi-tone mask (also referred to as a half-tone mask) can be used. A layer to be a partition is formed over the insulating layer in which a groove is not provided and the lower electrode including the first and second lower electrodes 118b and 118g, and a photoresist film is stacked over the layer. Then, the photoresist film is exposed to light and developed, with a multi-tone mask having a high transmittance, a low transmittance, and a medium transmittance for a region where the layer to be the partition remains, a region where the layer to be the partition is removed, and a region where the first depression is formed, so that a resist pattern is formed. Then, the layer to be the partition is etched using the resist pattern as a mask; thus, the partition having the first depression is formed. Note that in the case of using a positive photosensitive resin layer as the layer to be the partition, a multi-tone mask having a high transmittance for the region where the resin layer is removed, a low transmittance for the region where the partition is formed, and a medium transmittance for the region where the first depression is formed may be used.

Figure 5:
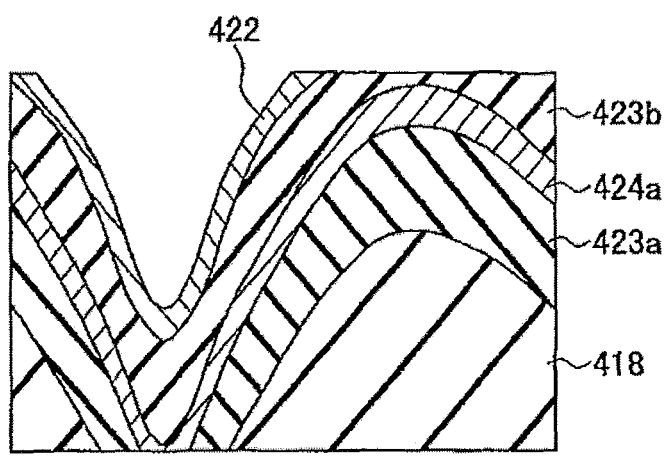
FIG. 5 is an enlarged cross-sectional view of a portion H illustrated in FIG. 4G.

Next, the light-emitting unit 423a is formed over the first lower electrode 118b, the second lower electrode 118g, and the partition 418 by an evaporation method, and the intermediate layer 424a which is a highly conductive layer is formed over this light-emitting unit 423a by an evaporation method. Then, the light-emitting unit 423b is formed over the intermediate layer 424a by an evaporation method, and the upper electrode 422 is formed over this light-emitting unit 423b. The intermediate layer is thinner in the regions over the first and second inclined surfaces than in the region over the first lower electrode 118b and the second lower electrode 118g (see FIG. 4F and FIG. 5).

Next, the color filters 441B, 441G and 441R that are near or in contact with the upper electrode 422 positioned over the partition 418 are formed, and the light-emitting element is enclosed together with an inert gas or a resin by a sealant (not illustrated) between the first substrate 410 and the second substrate 440. For example, a color filter-includes the blue color filter 441B overlapping with the second substrate 440 and the first lower electrode 118b and the green color filter 441G overlapping with the second lower electrode 118g. A light-blocking film 105 is formed between the blue color filter 441B and the green color filter 441G (see FIG. 4G).

Embodiment 2

A configuration example of a light-emitting element which can be used in a light-emitting module according to one embodiment of the present invention will be described with reference to FIGS. 6A to 6C.

The light-emitting element described as an example in this embodiment includes a lower electrode, an upper electrode, and a layer containing a light-emitting organic compound between the lower electrode and the upper electrode (hereinafter the layer is also referred to as an EL layer). One of the lower and upper electrodes functions as an anode, and the other functions as a cathode. The EL layer is provided between the lower electrode and the upper electrode, and a structure of the EL layer may be appropriately determined in accordance with materials of the lower electrode and the upper electrode.

<Configuration Example of Light-Emitting Element>

Figure 6A:
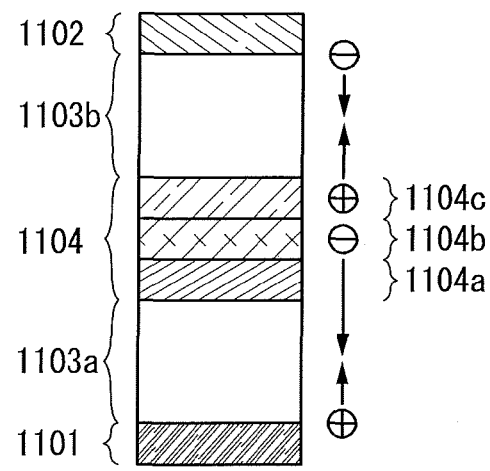
FIG. 6A illustrates an example of a structure of a light-emitting element.

An example of a configuration of the light-emitting element is illustrated in FIG. 6A. In the light-emitting element illustrated in FIG. 6A, an EL layer including a light-emitting unit 1103a and a light-emitting unit 1103b is provided between an anode 1101 and a cathode 1102. Furthermore, an intermediate layer 1104 is provided between the light-emitting unit 1103a and the light-emitting unit 1103b.

When a voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

The number of light-emitting units provided between the anode 1101 and the cathode 1102 is not limited to two. A light-emitting element illustrated in FIG. 6C has what is called a tandem structure, that is, a structure in which a plurality of light-emitting units 1103 is stacked. Note that in the case where n (n is a natural number greater than or equal to 2) light-emitting units 1103 are provided between the anode and the cathode, for example, the intermediate layer 1104 is provided between an m-th (m is a natural number greater than or equal to 1 and less than (n−1)) light-emitting unit and an (m+1)-th light-emitting unit.

The light-emitting unit 1103 includes at least one light-emitting layer containing a light-emitting substance, and may have a structure in which the light-emitting layer and a layer other than the light-emitting layer are stacked. Examples of the layer other than the light-emitting layer are layers which contain a substance having a high hole-injection property, a substance having a high hole-transport property, a substance having a poor hole-transport property (substance which blocks holes), a substance having a high electron-transport property, a substance having a high electron-injection property, a substance having a bipolar property (substance having high electron- and hole-transport properties), and the like. In particular, the layer which contains a substance having a high hole-injection property and is provided in contact with the anode and the layer which contains a substance having a high electron-injection property and is provided in contact with the cathode serve to lower a barrier against carrier injection from the electrodes to the light-emitting unit. These layers can be each referred to as a carrier-injection layer.

Figure 6B:
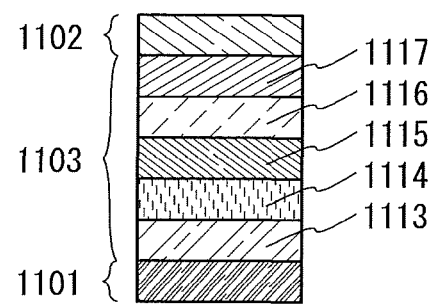
FIG. 6B illustrates an example of a specific structure of a light-emitting unit.
Figure 6C:
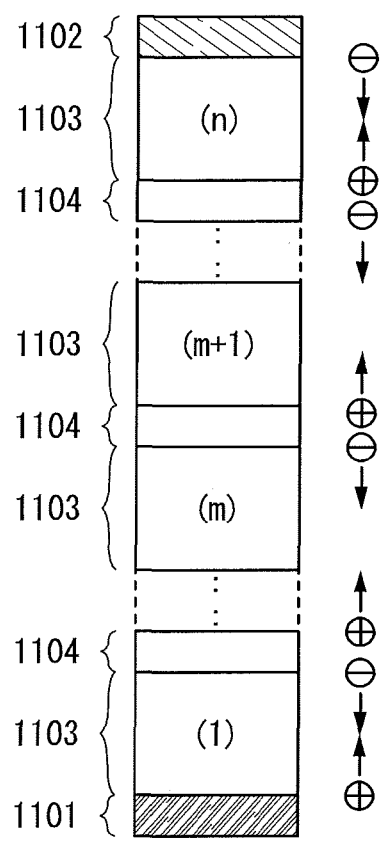
FIG. 6C illustrates a structure of a tandem light-emitting element in which a plurality of light-emitting units is stacked.
Figure 7A:
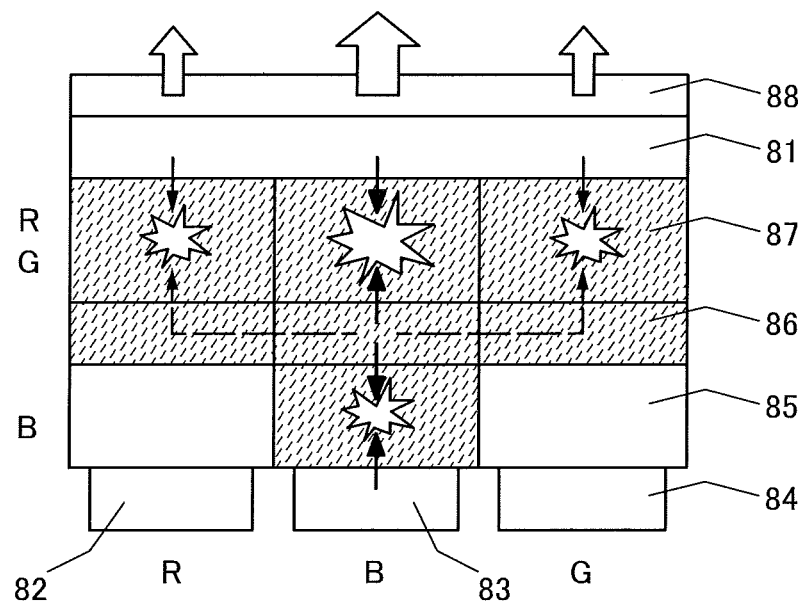
FIG. 7A is a schematic view for describing the crosstalk phenomenon caused by a highly conductive intermediate layer.
Figure 7B:
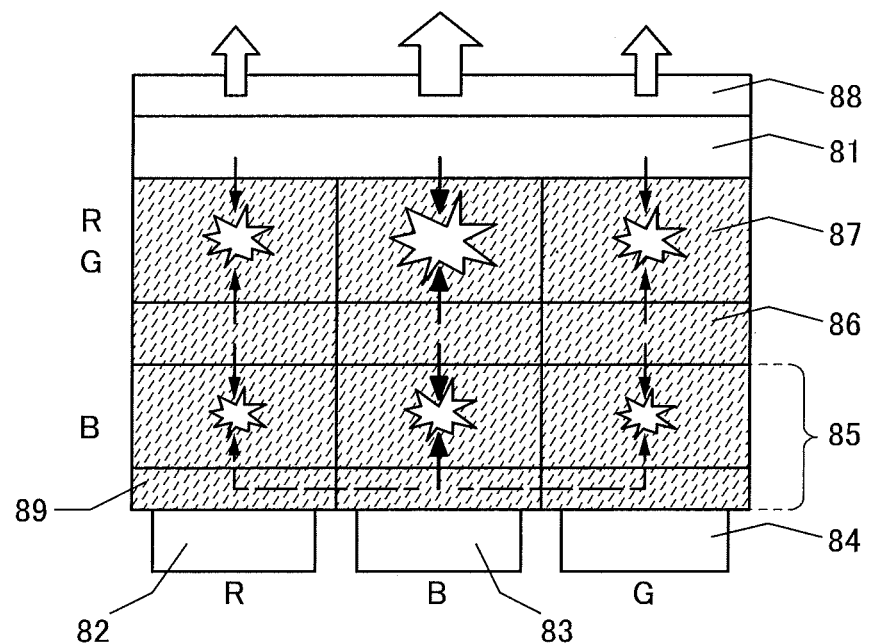
FIG. 7B is a schematic view for describing the crosstalk phenomenon caused by a highly conductive carrier-injection layer.

An example of a specific configuration of the light-emitting unit 1103 is illustrated in FIG. 6B. In the light-emitting unit 1103 illustrated in FIG. 6B, a hole-injection layer 1113, a hole-transport layer 1114, a light-emitting layer 1115, an electron-transport layer 1116, and an electron-injection layer 1117 are stacked in this order from the anode 1101 side.

An example of a specific structure of the intermediate layer 1104 is illustrated in FIG. 6A. The intermediate layer 1104 may be formed to include at least a charge-generation region, and may have a structure in which the charge-generation region and a layer other than the charge-generation region are stacked. For example, a structure can be employed in which a first charge-generation region 1104c, an electron-relay layer 1104b, and an electron-injection buffer layer 1104a are stacked in this order from the cathode 1102 side.

The behaviors of electrons and holes in the intermediate layer 1104 are described. When a voltage higher than the threshold voltage of the light-emitting element is applied between the anode 1101 and the cathode 1102, in the first charge-generation region 1104c, holes and electrons are generated, and the holes move into the light-emitting unit 1103b provided on the cathode 1102 side and the electrons move into the electron-relay layer 1104b.

The electron-relay layer 1104b has a high electron-transport property and immediately transfers the electrons generated in the first charge-generation region 1104c to the electron-injection buffer layer 1104a. The electron-injection buffer layer 1104a can lower a barrier against electron injection into the light-emitting unit 1103a, so that the efficiency of the electron injection into the light-emitting unit 1103a is increased. Thus, the electrons generated in the first charge-generation region 1104c are injected into the lowest unoccupied molecular orbital (hereinafter referred to as "LUMO level") of the light-emitting unit 1103a through the electron-relay layer 1104b and the electron-injection buffer layer 1104a.

In addition, the electron-relay layer 1104b can prevent interaction in which the substance included in the first charge-generation region 1104c and the substance included in the electron-injection buffer layer 1104a react with each other at the interface therebetween and the functions of the first charge-generation region 1104c and the electron-injection buffer layer 1104a are impaired.

The holes injected into the light-emitting unit 1103b provided on the cathode side are recombined with electrons injected from the cathode 1102, so that a light-emitting substance contained in the light-emitting unit 1103*b* emits light. The electrons injected into the light-emitting unit 1103*a* provided on the anode side are recombined with holes injected from the anode side, so that a light-emitting substance contained in the light-emitting unit 1103*a* emits light. Thus, the holes and electrons generated in the intermediate layer 1104 cause light emission in different light-emitting units.

Note that the light-emitting units can be provided in contact with each other when these light-emitting units allow the same structure as the intermediate layer to be formed therebetween. Specifically, when one surface of the light-emitting unit is provided with a charge-generation region, the charge-generation region functions as a first charge-generation region of the intermediate layer; thus, the light-emitting units can be provided in contact with each other.

Note that an intermediate layer may be provided between the cathode and the n-th light-emitting unit.

<Material for Light-Emitting Element>

Next, specific materials that can be used for the light-emitting element having the above-described structure are described. Materials for the anode, the cathode, the EL layer, the charge-generation region, the electron-relay layer, and the electron-injection buffer layer are described in this order.

<Material for Anode>

The anode 1101 is preferably formed using a metal, an alloy, an electrically conductive compound, a mixture of these materials, or the like which has a high work function (specifically, a work function of higher than or equal to 4.0 eV is more preferable). Specifically, for example, indium tin oxide (ITO), indium tin oxide containing silicon or silicon oxide, indium zinc oxide (IZO), indium oxide containing tungsten oxide and zinc oxide, and the like are given.

Besides, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

Note that in the case where a second charge-generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge-generation region will be subsequently described together with a material for forming the first charge-generation region.

<Material for Cathode>

As a material of the cathode 1102, a material having a low work function (specifically, a work function of lower than 4.0 eV) is preferably used; however, in the case where the first charge-generation region is provided between the cathode 1102 and the light-emitting unit 1103 to be in contact with the cathode 1102, various conductive materials can be used for the cathode 1102 regardless of their work functions.

Note that at least one of the cathode 1102 and the anode 1101 is formed using a conductive film that transmits visible light. For the conductive film that transmits visible light, for example, a film of indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given.

Further, a metal thin film having a thickness small enough to transmit light (preferably, approximately 5 nm to 30 nm) can also be used.

<Material for EL Layer>

Specific examples of materials for the layers included in the light-emitting unit 1103 will be given below.

<Hole-Injection Layer>

The hole-injection layer contains a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a polymer such as poly(3,4-ethylenedioxythiophene)/poly(styrenesulfonate) (PEDOT/PSS), or the like to form the hole-injection layer.

Note that the second charge-generation region may be used instead of the hole-injection layer. When the second charge-generation region is used, a variety of conductive materials can be used for the anode 1101 regardless of their work functions as described above. A material for the second charge-generation region will be subsequently described together with a material for forming the first charge-generation region.

<Hole-Transport Layer>

The hole-transport layer contains a substance having a high hole-transport property. The hole-transport layer is not limited to a single layer, and may be a stack of two or more layers each containing a substance having a high hole-transport property. The hole-transport layer contains any substance having a higher hole-transport property than an electron-transport property, and preferably contains a substance having a hole mobility of $10^{-6}$ $cm^2/Vs$ or higher because the driving voltage of the light-emitting element can be reduced.

<Light-Emitting Layer>

The light-emitting layer contains a light-emitting substance. The light-emitting layer is not limited to a single layer, and may be a stack of two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

The light-emitting substance is preferably dispersed in a host material. A host material preferably has higher excitation energy than the light-emitting substance.

<Electron-Transport Layer>

The electron-transport layer contains a substance having a high electron-transport property. The electron-transport layer is not limited to a single layer, and may be a stack of two or more layers each containing a substance having a high electron-transport property. The electron-transport layer contains any substance having a higher electron-transport property than a hole-transport property, and preferably contains a substance having an electron mobility of $10^{-6}$ $cm^2/Vs$ or higher because the driving voltage of the light-emitting element can be reduced.

<Electron-Injection Layer>

The electron-injection layer contains a substance having a high electron-injection property. The electron-injection layer is not limited to a single layer, and may be a stack of two or more layers each containing a substance having a high electron-injection property. The electron-injection layer is preferably provided because the efficiency of electron injection from the cathode 1102 can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Charge Generation Region>

The first charge-generation region 1104c and the second charge-generation region are regions containing a substance having a high hole-transport property and an acceptor substance with respect to the substance having a high hole-transport property. Note that the charge-generation region is not limited to the structure in which one film contains the substance having a high hole-transport property and the acceptor substance with respect to the substance having a high hole-transport property, and may be a stacked layer of a layer containing the substance having a high hole-transport property and a layer containing the acceptor substance with respect to the substance having a high hole-transport property. Note that in the case where the first charge-generation region which is in contact with the cathode has a stacked-layer structure, the layer containing the substance having a high hole-transport property is in contact with the cathode 1102. In the case where the second charge-generation region which is in contact with the anode has a stacked-layer structure, the layer containing the acceptor substance with respect to the substance having a high hole-transport property is in contact with the anode 1101.

Note that the acceptor substance with respect to the substance having a high hole-transport property is preferably added to the charge-generation region so that the mass ratio of the acceptor substance to the substance having a high hole-transport property is from 0.1:1 to 4.0:1.

As the acceptor substance with respect to the substance having a high hole-transport property, which is used for the charge-generation region, a transition metal oxide, particularly an oxide of a metal belonging to any of Groups 4 to 8 of the periodic table is preferable. Specifically, molybdenum oxide is particularly preferable. Note that molybdenum oxide has a low hygroscopic property.

As the substance having a high hole-transport property used for the charge-generation region, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of 10$^{-6}$ cm$^2$/Vs or higher is preferably used. However, any substance other than the above-described materials may also be used as long as the substance has a higher hole-transport property than an electron-transport property.

<Material for Electron-Relay Layer>

The electron-relay layer 1104b can immediately receive electrons drawn out by the acceptor substance with respect to the substance having a high hole-transport property in the first charge-generation region 1104c. Therefore, the electron-relay layer 1104b contains a substance having a high electron-transport property, and the LUMO level thereof is positioned between the acceptor level of the acceptor substance with respect to the substance having a high hole-transport property in the first charge-generation region 1104c and the LUMO level of the light-emitting unit 1103.

Specifically, the LUMO level of the electron-relay layer 1104b is preferably about from −5.0 eV to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or fluorine is preferably used because such a compound further facilitates acceptance of electrons in the electron-relay layer 1104b.

<Material for Electron-Injection Buffer Layer>

The electron-injection buffer layer 1104a facilitates electron injection from the first charge-generation region 1104c into the light-emitting unit 1103a. By providing the electron-injection buffer layer 1104a between the first charge-generation region 1104c and the light-emitting unit 1103a, the injection barrier therebetween can be lowered.

A substance having a high electron-injection property can be used for the electron-injection buffer layer 1104a. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

Further, in the case where the electron-injection buffer layer 1104a contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron-transport property, a material similar to the above material for the electron-transport layer which can be formed in part of the light-emitting unit 1103 can be used.

<Method of Manufacturing Light-Emitting Element>

A method for manufacturing the light-emitting element will be described. Over the lower electrode, the layers described above are combined as appropriate to form an EL layer. Any of a variety of methods (e.g., a dry process or a wet process) can be used to form the EL layer depending on the material for the EL layer. For example, a vacuum evaporation method, an inkjet method, a spin coating method, or the like may be selected. Note that a different formation method may be employed for each layer. The upper electrode is formed over the EL layer, so that the light-emitting element is manufactured.

The light-emitting element described in this embodiment can be manufactured by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. In order to obtain white light emission, for example, a configuration may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

Note that this embodiment can be implemented in an appropriate combination with any of the other embodiments described in this specification.

This application is based on Japanese Patent Application serial no. 2012-280103 filed with Japan Patent Office on Dec. 21, 2012, the entire contents of which are hereby incorporated by reference.

What is claimed is:

1. A light-emitting device comprising:
an insulating layer;
a first lower electrode over the insulating layer;
a second lower electrode over the insulating layer;
a partition over the insulating layer and between the first lower electrode and the second lower electrode;
a first light-emitting unit over the first lower electrode, the partition, and the second lower electrode, the first light-emitting unit comprising a first hole-injection layer, a first hole-transport layer, a first light-emitting layer, a first electron-transport layer, and a first electron-injection layer;
an intermediate layer over the first light-emitting unit;
a second light-emitting unit over the intermediate layer, the second light-emitting unit comprising a second hole-injection layer, a second hole-transport layer, a second light-emitting layer, a second electron-transport layer, and a second electron-injection layer; and
an upper electrode over the second light-emitting unit,
wherein the partition comprises a first depression,
wherein the insulating layer comprises a second depression,
wherein the partition is in the second depression,
wherein the first depression is over the second depression, and
wherein a thickness of the intermediate layer over an inclined surface of the first depression in a direction perpendicular to the inclined surface is smaller than a thickness of the intermediate layer over the first lower electrode in a direction perpendicular to the first lower electrode.

2. The light-emitting device according to claim 1, further comprising a color filter near or in contact with the upper electrode,
wherein colors of the color filter are a first color in a region overlapping with the first lower electrode and a second color in a region overlapping with the second lower electrode.

3. The light-emitting device according to claim 1, wherein the partition is colored.

4. The light-emitting device according to claim 1, wherein the partition covers an edge portion of the first lower electrode and an edge portion of the second lower electrode.

5. The light-emitting device according to claim 1, wherein the conductivity of the intermediate layer is higher than the conductivity of the first light-emitting unit, and
wherein the conductivity of the intermediate layer is higher than the conductivity of the second light-emitting unit.

6. A light-emitting device comprising:
an insulating layer;
a first lower electrode over the insulating layer;
a second lower electrode over the insulating layer;
a partition over the insulating layer and between the first lower electrode and the second lower electrode;
a first light-emitting unit over the first lower electrode, the partition, and the second lower electrode, the first light-emitting unit comprising a first hole-injection layer, a first hole-transport layer, a first light-emitting layer, a first electron-transport layer, and a first electron-injection layer;
an intermediate layer over the first light-emitting unit;
a second light-emitting unit over the intermediate layer, the second light-emitting unit comprising a second hole-injection layer, a second hole-transport layer, a second light-emitting layer, a second electron-transport layer, and a second electron-injection layer; and
an upper electrode over the second light-emitting unit,
wherein the partition has a valley, a first mountain to the first lower electrode side of the valley, and a second mountain to the second lower electrode side of the valley,
wherein a thickness of the intermediate layer over a first inclined surface between a top of the first mountain and the valley in a direction perpendicular to the first inclined surface is smaller than a thickness of the intermediate layer over the first lower electrode in a direction perpendicular to the first lower electrode,
wherein a thickness of the intermediate layer over a second inclined surface between a top of the second mountain and the valley in a direction perpendicular to the second inclined surface is smaller than the thickness of the intermediate layer over the first lower electrode in the direction perpendicular to the first lower electrode,
wherein the insulating layer comprises a groove,
wherein the partition is in the groove, and
wherein the valley is over a bottom of the groove.

7. A method for manufacturing a light-emitting device, comprising the steps of:
forming a first lower electrode and a second lower electrode over an insulating layer;
forming a partition in a second depression of the insulating layer and between the first lower electrode and the second lower electrode, wherein the partition comprises a first depression over the second depression;
forming a first light-emitting unit over the first lower electrode, the partition, and the second lower electrode, the first light-emitting unit comprising a first hole-injection layer, a first hole-transport layer, a first light-emitting layer, a first electron-transport layer, and a first electron-injection layer;
forming an intermediate layer over the first light-emitting unit;
forming a second light-emitting unit over the intermediate layer, the second light-emitting unit comprising a second hole-injection layer, a second hole-transport layer, a second light-emitting layer, a second electron-transport layer, and a second electron-injection layer; and forming an upper electrode over the second light-emitting unit, wherein a thickness of the intermediate layer over an inclined surface of the first depression in a direction perpendicular to the inclined surface is smaller than a thickness of the intermediate layer over the first lower electrode in a direction perpendicular to the first lower electrode.

8. The method for manufacturing a light-emitting device, according to claim 7, further comprising the step of forming a color filter near or in contact with the upper electrode, after the step of forming the upper electrode, wherein colors of the color filter are a first color in a region overlapping with the first lower electrode and a second color in a region overlapping with the second lower electrode.

9. The method for manufacturing a light-emitting device, according to claim 7, wherein the partition is colored.

10. A method for manufacturing a light-emitting device, comprising the steps of:

forming an insulating layer over a first wiring and a second wiring;

forming a first contact hole over the first wiring, a second contact hole over the second wiring, and a second depression in the insulating layer;

forming a first lower electrode on one side of the second depression, in the first contact hole and over the insulating layer, and forming a second lower electrode on the other side of the second depression, in the second contact hole and over the insulating layer;

forming a partition in the second depression and over the insulating layer;

forming a first light-emitting unit over the first lower electrode, the partition, and the second lower electrode, the first light-emitting unit comprising a first hole-injection layer, a first hole-transport layer, a first light-emitting layer, a first electron-transport layer, and a first electron-injection layer;

forming an intermediate layer over the first light-emitting unit;

forming a second light-emitting unit over the intermediate layer, the second light-emitting unit comprising a second hole-injection layer, a second hole-transport layer, a second light-emitting layer, a second electron-transport layer, and a second electron-injection layer; and forming an upper electrode over the second light-emitting unit, wherein the partition has a first depression over the second depression, and wherein a thickness of the intermediate layer over an inclined surface of the first depression in a direction perpendicular to the inclined surface is smaller than a thickness of the intermediate layer over the first lower electrode in a direction perpendicular to the first lower electrode.

11. A method for manufacturing a light-emitting device, comprising the steps of:

forming an insulating layer over a first wiring and a second wiring;

forming a first contact hole over the first wiring, a second contact hole over the second wiring, and a groove in the insulating layer;

forming a first lower electrode on one side of the groove, in the first contact hole and over the insulating layer, and forming a second lower electrode on the other side of the groove, in the second contact hole and over the insulating layer;

forming a partition in the groove and over the insulating layer;

forming a first light-emitting unit over the first lower electrode, the partition, and the second lower electrode, the first light-emitting unit comprising a first hole-injection layer, a first hole-transport layer, a first light-emitting layer, a first electron-transport layer, and a first electron-injection layer;

forming an intermediate layer over the first light-emitting unit;

forming a second light-emitting unit over the intermediate layer, the second light-emitting unit comprising a second hole-injection layer, a second hole-transport layer, a second light-emitting layer, a second electron-transport layer, and a second electron-injection layer; and forming an upper electrode over the second light-emitting unit, wherein the partition has a valley over a bottom of the groove, a first mountain to the first lower electrode side of the valley, and a second mountain to the second lower electrode side of the valley, wherein a thickness of the intermediate layer over a first inclined surface between a top of the first mountain and the valley in a direction perpendicular to the first inclined surface is smaller than a thickness of the intermediate layer over the first lower electrode in a direction perpendicular to the first lower electrode, and wherein a thickness of the intermediate layer over a second inclined surface between a top of the second mountain and the valley in a direction perpendicular to the second inclined surface is smaller than the thickness of the intermediate layer over the first lower electrode in the direction perpendicular to the first lower electrode.

\* \* \* \* \*